US012777948B2

(12) United States Patent
Lee

(10) Patent No.: US 12,777,948 B2
(45) Date of Patent: Oct. 27, 2026

(54) SEMICONDUCTOR PACKAGE AND WIRING SUBSTRATE INCLUDED IN THE SAME

(71) Applicant: Samsung Electronics Co., Ltd., Suwon-si (KR)

(72) Inventor: Kang Joon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 277 days.

(21) Appl. No.: 18/628,413

(22) Filed: Apr. 5, 2024

(65) Prior Publication Data

US 2025/0062244 A1 Feb. 20, 2025

(30) Foreign Application Priority Data

Aug. 17, 2023 (KR) ........................ 10-2023-0107660

(51) Int. Cl.

| | |
|---|---|
| ***H10W 70/60*** | (2026.01) |
| ***H10W 70/05*** | (2026.01) |
| ***H10W 70/685*** | (2026.01) |
| ***H10W 90/00*** | (2026.01) |
| *H10W 72/30* | (2026.01) |
| *H10W 72/90* | (2026.01) |
| *H10W 74/00* | (2026.01) |

(52) U.S. Cl.

CPC ....... *H10W 70/614* (2026.01); *H10W 70/098* (2026.01); *H10W 70/685* (2026.01); *H10W 90/701* (2026.01); *H10W 72/321* (2026.01); *H10W 72/344* (2026.01); *H10W 72/9223* (2026.01); *H10W 72/923* (2026.01); *H10W 72/942* (2026.01); *H10W 74/00* (2026.01)

(58) Field of Classification Search

CPC ............. H10W 70/614; H10W 70/098; H10W 70/685; H10W 70/60; H10W 90/701; H10W 72/321; H10W 72/344; H10W 72/9223; H10W 72/942; H10W 72/20; H10W 74/00

See application file for complete search history.

(56) References Cited

U.S. PATENT DOCUMENTS

| | | | | |
|---|---|---|---|---|
| 9,704,827 | B2 | 7/2017 | Huang et al. | |
| 11,276,633 | B2 | 3/2022 | Kim et al. | |
| 2007/0114674 | A1 | 5/2007 | Brown | |
| 2020/0118955 | A1 | 4/2020 | Gogineni et al. | |
| 2021/0407962 | A1* | 12/2021 | Kim ...................... | H10W 90/00 |
| 2022/0077066 | A1* | 3/2022 | Kim .................... | H10W 70/611 |
| 2022/0328394 | A1 | 10/2022 | Chang | |

(Continued)

FOREIGN PATENT DOCUMENTS

| | | | |
|---|---|---|---|
| KR | 10-2004-0083192 | A | 10/2004 |
| KR | 10-0886714 | B1 | 3/2009 |

*Primary Examiner* — Mohsen Ahmadi

(74) *Attorney, Agent, or Firm* — Muir Patent Law, PLLC

(57) ABSTRACT

A semiconductor package according to an embodiment includes a semiconductor chip, and a redistribution portion electrically connected to the semiconductor chip. The redistribution portion includes an inner insulation layer, an interconnection pad, and an outer insulation layer. The interconnection pad is on the inner insulation layer and includes a first region and a second region outside the first region and having an opening. The outer insulation layer includes a first portion on the second region of the interconnection pad and a second portion filling at least a part of the opening.

17 Claims, 17 Drawing Sheets

(56) References Cited

U.S. PATENT DOCUMENTS

| | | | | |
|---|---|---|---|---|
| 2022/0359482 | A1* | 11/2022 | Farooq | H10W 40/228 |
| 2023/0131240 | A1* | 4/2023 | Ko | H10W 70/65<br>257/690 |
| 2023/0154834 | A1* | 5/2023 | Li | H10W 44/601<br>257/738 |
| 2024/0014139 | A1* | 1/2024 | Kwon | H10W 70/611 |
| 2024/0030119 | A1* | 1/2024 | Kim | H10W 70/685 |

* cited by examiner

SEMICONDUCTOR PACKAGE AND WIRING SUBSTRATE INCLUDED IN THE SAME

CROSS-REFERENCE TO RELATED APPLICATION

This application claims priority under 35 U.S.C § 119 to and the benefit of Korean Patent Application No. 10-2023-0107660 filed in the Korean Intellectual Property Office on Aug. 17, 2023, the entire contents of which are herein incorporated by reference.

BACKGROUND

(a) Field

The present disclosure relates to a semiconductor package and a wiring substrate included in the same.

(b) Description of the Related Art

A semiconductor device may have a small size while performing various functions, and semiconductor devices are thus widely used in various areas of electronics industry. As advancements are made in the electronics industry, research on packaging technology has continued to reduce sizes of semiconductor devices while increasing performance.

A semiconductor device may include a semiconductor chip, a pad where a solder member for connection with an electronic element or the like is positioned, and an insulation layer at a periphery of the pad. The insulation layer may have a solder mask defined (SMD) structure covering an edge region of the pad or a non-solder mask defined (NSMD) structure not covering the pad.

By the solder mask defined structure, an area of the pad adhered to the solder member may be easily adjusted, and resistance to stress applied to the pad may be relatively high. However, adhesion force between the pad and the insulation layer may be not sufficient, and the insulation layer covering the edge region of the pad may be easily peeled from the pad and a crack may be initiated at the insulation layer.

SUMMARY

The present disclosure provides a semiconductor package and a wiring substrate included in the same capable of reducing defects and enhancing reliability.

A semiconductor package according to an embodiment includes a semiconductor chip, and a redistribution portion electrically connected to the semiconductor chip. The redistribution portion includes an inner insulation layer, an interconnection pad, and an outer insulation layer. The interconnection pad is on the inner insulation layer and includes a first region and a second region outside the first region and having an opening. The outer insulation layer includes a first portion on the second region of the interconnection pad and a second portion filling at least a part of the opening.

A wiring substrate according to an embodiment includes an inner insulation layer, an interconnection pad, and an outer insulation layer. The interconnection pad is on the inner insulation layer and includes a first region and a second region outside the first region and having an opening. The outer insulation layer includes a first portion on the second region of the interconnection pad and a second portion filling at least a part of the opening.

A semiconductor package according to an embodiment includes an insulation layer, an interconnection pad on the insulation layer, and a cover insulation layer. The cover insulation layer is on an edge region of the interconnection pad on the insulation layer, and includes a connection portion penetrating a part of the interconnection pad and connected to the insulation layer.

According to an embodiment, peeling/detachment of an outer insulation layer from an interconnection pad and a crack initiation or propagation at the inner insulation layer may be prevented or suppressed by improving structures of the interconnection pad and the outer insulation layer. Accordingly, defects of a semiconductor package or a wiring substrate may be reduced and reliability of the semiconductor package or the wiring substrate may be enhanced.

DETAILED DESCRIPTION

Figure 1:
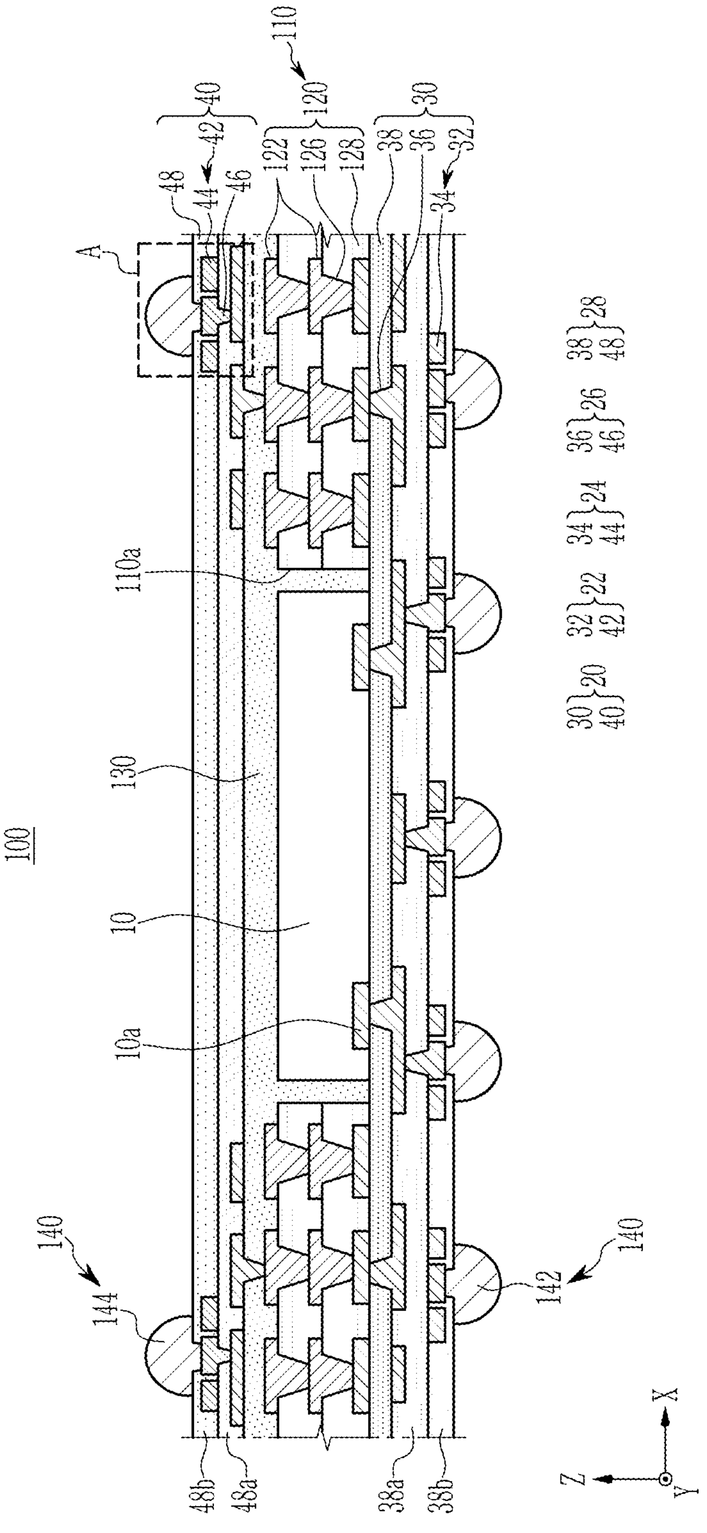
FIG. 1 is a cross-sectional view of a semiconductor package according to an embodiment.

Embodiments of the present disclosure will be described more fully hereinafter with reference to the accompanying drawings for those skilled in the art to which the present disclosure pertains to easily practice the present disclosure. The present disclosure may be implemented in various different forms and is not limited to the embodiments provided herein.

Portions of devices unrelated to main ideas may be omitted in order to clearly describe the present disclosure, and the same or similar components are denoted by the same reference numeral throughout the present specification.

Further, since sizes and thicknesses of portions, regions, members, units, layers, films, etc. shown in the accompanying drawings may be arbitrarily shown for better understanding and convenience of explanation, the present disclosure is not limited to the illustrated sizes and thicknesses. In the drawings, thicknesses of portions, regions, members, units, layers, films, etc. may be enlarged or exaggerated for convenience of explanation.

It will be understood that when a component such as a layer, film, region, or substrate is referred to as being "on" another component, it may be directly on other component or an intervening component may also be present. In contrast, when a component is referred to as being "directly on" another component, there is no intervening component present. Further, when a component is referred to as being "on" or "above" a reference component, a component may be positioned on or below the reference component, and does not necessarily be "on" or "above" the reference component toward an opposite direction of gravity.

In addition, unless explicitly described to the contrary, the word "comprise", and variations such as "comprises" or "comprising", will be understood to imply the inclusion of stated elements but not the exclusion of any other elements.

Further, throughout the specification, a phrase "on a plane", "in a plane", "on a plan view", or "in a plan view" may indicate a case where a portion is viewed from above or a top portion, and a phrase "on a cross-section" or "in a cross-section" may indicate when a cross-section taken along a vertical direction is viewed from a side.

Hereinafter, with reference to FIG. 1 to FIG. 3, FIG. 4A, FIG. 4B, FIG. 5A to FIG. 5E, a semiconductor package and a wiring substrate included in the same according to an embodiment will be described in detail.

Figure 2:
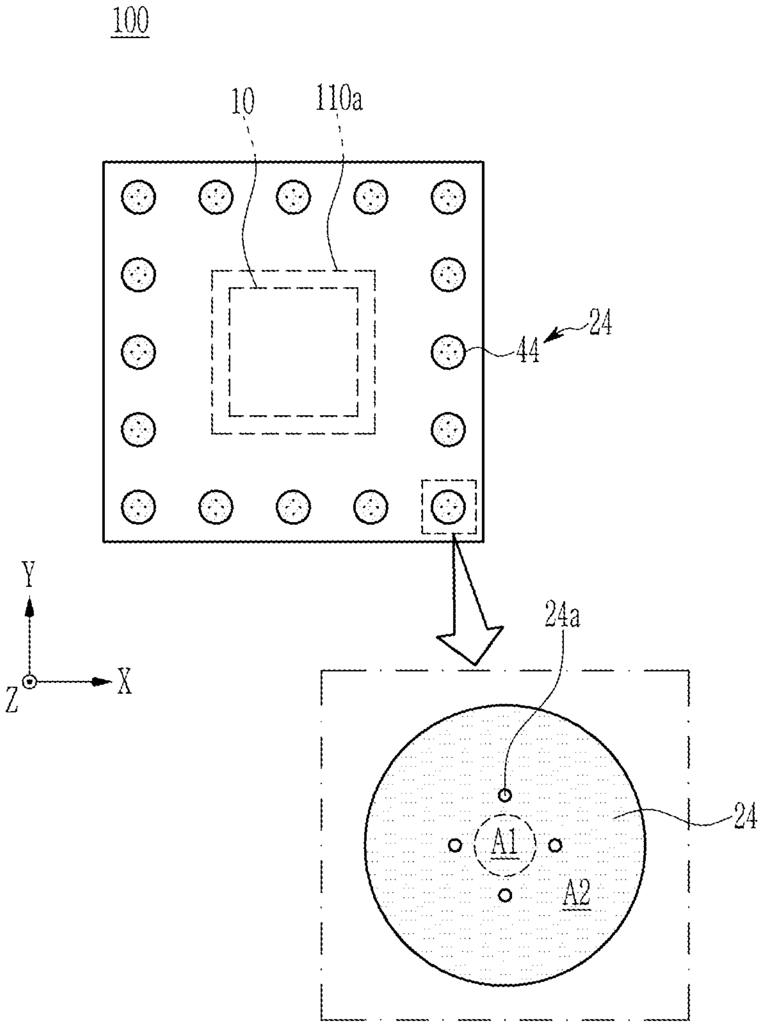
FIG. 2 is a top plan view schematically illustrating a portion where an interconnection pad is positioned in the semiconductor package shown in FIG. 1.

FIG. 1 is a cross-sectional view of a semiconductor package according to an embodiment, and FIG. 2 is a top plan view schematically illustrating a portion where an interconnection pad is positioned in the semiconductor package shown in FIG. 1.

Each of Various pads described herein may generally have a planar upper surface having horizontal dimensions (e.g., in both the X and Y directions) that are both larger than a width of wiring to which the pad is connected to facilitate connections thereto (e.g., to provide a larger surface to contact with a later formed via). For example, a horizontal wiring may be integrally formed with a pad (e.g., patterned out of the same metal layer) such that the wiring and the pad have coplanar upper surfaces, with both of the X and Y horizontal dimensions of the pad being greater than the horizontal width of the wiring (e.g., greater or equal to 3 times the horizontal width of the wiring). In other examples, a pad may be discretely formed such that it is not in contact with any wiring formed at its vertical level within the device and is only connected to wiring within the device by vias. From a top down view, a pad may have a symmetrical shape (e.g., a circular, square, or rectangular footprint) and may have X and Y horizontal dimensions that are about the same (e.g., within half to two times of the other).

Referring to FIG. 1 and FIG. 2, a semiconductor package 100 according to an embodiment includes a semiconductor chip 10 and a redistribution portion 20. The redistribution portion 20 may be electrically connected to the semiconductor chip 10 and include an interconnection pad 24. Here, the redistribution portion 20 may include an insulation layer 28 including an inner insulation layer 28*a* (refer to FIG. 3) and an outer insulation layer 28*b* (refer to FIG. 3), and a redistribution layer 22 including the interconnection pad 24. The semiconductor package 100 may further include a frame portion 110 including an intermediate redistribution portion 120, a molding portion 130, an interconnection member 140, or the like. For example, the frame portion 110 may be a frame surrounding the semiconductor chip 10. This will be described in more detail.

As used herein, components described as being "electrically connected" are configured such that an electrical signal can be transferred from one component to the other (although such electrical signal may be attenuated in strength as it transferred and may be selectively transferred).

In the embodiment, the frame portion 110 may include a space portion 110*a* for providing a space where the semiconductor chip 10 is positioned. The space portion 110*a* may have a shape of a penetration portion or a through hole penetrating the frame portion 110. For example, the space portion 110*a* may be a space surrounded by the intermediate redistribution portion 120. However, the embodiments are not limited thereto.

The frame portion 110 may include the intermediate redistribution portion 120 configured to be a part of a redistribution portion included in the semiconductor package 100. For example, the frame portion 110 or the intermediate redistribution portion 120 included in the frame portion 110 may include a plurality of redistribution layers 122 positioned with an interlayer insulation layer 128 interposed therebetween, and a contact via 126 electrically connecting the plurality of redistribution layers 122 through/by penetrating the interlayer insulation layer 128. The redistribution layer 122 and the contact via 126 may be electrically connected to constitute a desire circuit.

The interlayer insulation layer 128 may include or be formed of any of various insulating materials that may electrically insulate wirings that should not be electrically connected. The insulating material may include or may be a thermosetting resin such as an epoxy resin, a thermoplastic resin such as a polyimide, a resin including an inorganic filler and/or a glass fiber, or the like. The interlayer insulation layer 128 may include or be formed of a photosensitive resin such as a photoimageable dielectric (PID) material. When the interlayer insulation layer 128 include or be formed of the PID material, each interlayer insulation layer 128 may be thinly formed, the contact via 126 may be finely formed, and the redistribution layer 122 may be easily formed by a plating process. The plurality of interlayer insulation layers 128 may include or be formed of the same material or may include different materials from each other. Depending on a process, an interface between the plurality of interlayer insulation layers 128 may not be clear/recognizable.

The redistribution layer 122 or the contact via 126 may include or be formed of any of various conductive materials. At least two of the plurality of the redistribution layers 122 and the contact via 126 may include or be formed of the same material or may include different materials from each other. The redistribution layer 122 or the contact via 126 may include or be formed of a single layer, or may include a plurality of layers. For example, the redistribution layer 122 or the contact via 126 may include at least one of copper, aluminum, tungsten, nickel, gold, tin, manganese, cobalt, titanium, tantalum, ruthenium, and beryllium or an alloy including the same.

In the embodiment, the semiconductor chip 10 may include or may be a memory chip for storing data, a non-memory chip for calculating, processing, or controlling information, or a merged semiconductor chip merging a memory portion and a non-memory portion, or may be replaced by a plurality of chips. For example, the memory chip may be a volatile memory, such as a dynamic random access memory (DRAM), a static random access memory (SRAM), or a non-volatile memory such as a NAND flash memory system. For example, the non-memory chip or the merged semiconductor chip may be a central processing unit (CPU), a graphic processing unit (GPU), a neural processing unit (NPU), a micro controller unit (MCU), an application processor (AP), an application-specific integrated circuit (ASIC), an image sensor, or the like. Accordingly, the semiconductor chip 10 is not limited to a specific kind of semiconductor chip.

A pad 10*a* may be at one surface (for example, a lower surface) of the semiconductor chip 10. For example, a plurality of pads 10*a* may be formed in the lower surface of the semiconductor chip 10. The pad 10*a* may be a portion for electrically connecting the semiconductor chip 10 to the redistribution portion included in the semiconductor package 100 or an outside. The pads 10*a* may be redistributed by the intermediate redistribution portion 120, a first redistribution portion 30, and/or a second redistribution portion 40. For example, an arrangement of the pads 10*a* may be redistributed to another arrangement of pads formed in a first redistribution portion 30 and/or a second redistribution portion 40. The pads 10*a* may include or be formed of any of various conductive materials and may have any of various shapes. For example, the pads 10*a* may include or be formed of at least one of copper, aluminum, tungsten, nickel, gold, tin, manganese, cobalt, titanium, tantalum, ruthenium, and beryllium or an alloy including the same.

In the above description, it is illustrated as an example that one semiconductor chip 10 is disposed in the space portion 110*a* of the frame portion 110. However, the embodiments are not limited thereto. An electronic component including any of various active or passive elements may be in the space portion 110*a* of the frame portion 110. An electronic component, instead of the semiconductor chip 10, may be in the space portion 110*a*, an electronic component and a semiconductor chip 10 may be in the space portion 110*a*, or one or a plurality of the semiconductor chips 10 may be in the space portion 110*a*. Other various modifications are possible.

The molding portion 130 may constitute a molding of the semiconductor chip 10. For example, the molding portion 130 may encapsulate the semiconductor chip 10, e.g., along with the first redistribution portion 30. For example, the molding portion 130 may cover or surround the semiconductor chip 10 and/or the frame portion 110. For example, the molding portion 130 may contact top and side surfaces of the semiconductor chip 10. For example, the molding portion 130 may fill a space between the frame portion 110 and the semiconductor chip 10, and in some embodiments, the molding portion 130 may be additionally formed on the frame portion 110. For example, the molding portion 130 may be a molding structure/pattern. According to an embodiment, the molding portion 130 may include one layer or a plurality of layers. The molding portion 130 may include a thermosetting resin such as an epoxy resin, a thermoplastic resin such as a polyimide, a resin including an inorganic filler and/or a glass fiber, an epoxy molding compound (EMC), or the like. A material, a shape, or so on of the molding portion 130 may be variously modified.

In the drawing, it is illustrated as an example that an upper surface of the semiconductor chip 10 may be lower than an upper surface of the frame portion 110. However, the embodiments are not limited thereto. For example, the upper surface of the semiconductor chip 10 may be on the same plane as the upper surface of the frame portion 110 or may be positioned higher than the upper surface of the frame portion 110

In the embodiment, the redistribution portion 20 including the interconnection pad 24 may include a first redistribution portion 30 on one surface (e.g., a lower surface) of the semiconductor chip 10, and a second redistribution portion 40 on the other surface (e.g., an upper surface) of the semiconductor chip 10. For reference, the redistribution portion 20 including the interconnection pad 24 may be referred to as a redistribution substrate, a wiring substrate, a connection substrate, or the like. For example, each of the first and second redistribution portions 30 and 40 may be a redistribution substrate, a wiring substrate or a connection substrate. For example, each of the first and second redistribution portions 30 and 40 may be a substrate or an interposer.

The first redistribution portion 30 may be on one surface (e.g., a lower surface) of the frame portion 110, the semiconductor chip 10, and/or the molding portion 130. The first redistribution portion 30 may include a first redistribution layer 32 and a first contact via 36. The first redistribution layer 32 may be on a first insulation layer 38 positioned on the lower surface of the frame portion 110, the semiconductor chip 10, and/or the molding portion 130. The first contact via 36 may electrically connect the first redistribution layer 32 and the intermediate redistribution portion 120 through/by penetrating the first insulation layer 38. For example, the first redistribution portion 30 may include a plurality of first redistribution layers 32 positioned on the first insulation layer 38 interposed therebetween, and the first contact via 36 may electrically connect the plurality of first redistribution layers 32 through/by penetrating the first insulation layer 38. The first redistribution layer 32 and the first contact via 36 may be electrically connected (e.g., contact) to constitute a desire circuit.

In this instance, the first redistribution layer 32 that is the outermost redistribution layer in the first redistribution portion 30 (e.g. the first redistribution layer 32 at a bottom of the first redistribution portion 30) may include a first interconnection pad 34 to vertically overlap and/or contact a first interconnection member 142. The first redistribution portion 30 may include a plurality of first insulation layers 38. The first insulation layers 38 may include a first inner insulation layer 38*a* at an inside of the first redistribution portion 30, and a first outer insulation layer 38*b* covering at least a part of the first interconnection pad 34 on the first inner insulation layer 38*a*. The first interconnection pad 34, the first inner insulation layer 38*a*, and the first outer insulation layer 38*b* will be described later in more detail.

The second redistribution portion 40 may be on the other surface (e.g., an upper surface) of the frame portion 110, the semiconductor chip 10, and/or the molding portion 130. The second redistribution portion 40 may include a second redistribution layer 42 and a first contact via 46. The second redistribution layer 42 may be on a second insulation layer 48 positioned on the upper surface of the frame portion 110, the semiconductor chip 10, and/or the molding portion 130. The second contact via 46 may electrically connect the second redistribution layer 42 and the intermediate redistribution portion 120 through/by penetrating the second insulation layer 48. For example, the second redistribution portion 40 may include a plurality of second redistribution layers 42 positioned on the second insulation layer 48 interposed therebetween, and the second contact via 46 may electrically connect the plurality of second redistribution layers 42 through/by penetrating the second insulation layer 48. The second redistribution layer 42 and the first contact via 46 may be electrically connected (e.g., contact) to constitute a desire circuit.

In this instance, the second redistribution layer 42 that is the outermost redistribution layer in the second redistribution portion 40 (e.g. the second redistribution layer 42 at a top of the second redistribution portion 40) may include a second interconnection pad 44 to vertically overlap and/or contact a second interconnection member 144. The second redistribution portion 40 may include a plurality of second insulation layers 48. The second insulation layers 48 may include a second inner insulation layer 48*a* at an inside of the second redistribution portion 40, and a second outer insulation layer 48*b* covering at least a part of the second interconnection pad 44 on the second inner insulation layer 48*a*. The second interconnection pad 44, the second inner insulation layer 48*a*, and the second outer insulation layer 48*b* will be described later in more detail.

The first insulation layer 38 or the second insulation layer 48 may include or be formed of any of various insulating materials that may electrically insulate wirings that should not be electrically connected. The insulating material may include or may be a thermosetting resin such as an epoxy resin, a thermoplastic resin such as a polyimide, a resin including an inorganic filler and/or a glass fiber, or the like. The first insulation layer 38 or the second insulation layer 48 may include or be formed of a photosensitive resin such as a PID material. The plurality of first insulation layers 38 may include or be formed of the same material or may include different materials from each other, or the plurality of second insulation layers 48 may include or be formed of the same material or may include different materials from each other. Depending on a process, an interface between the plurality of first insulation layers 38 or between the plurality of second insulation layers 48 may not be clear/recognizable.

The first redistribution layer 32, the first contact via 36, the second redistribution layer 42, or the second contact via 46 may include or be formed of any of various conductive materials. At least two of the plurality of the first redistribution layers 32 and the first contact via 36 may include or be formed of the same material or may include different materials from each other. At least two of the plurality of the second redistribution layers 42 and the second contact via 46 may include or be formed of the same material or may include different materials from each other. The first redistribution layer 32 or the first contact via 36 may include or be formed of a single layer, or may include a plurality of layers. The second redistribution layer 42 or the second contact via 46 may include or be formed of a single layer, or may include a plurality of layers. For example, the first redistribution layer 32, the first contact via 36, the second redistribution layer 42, or the second contact via 46 may include at least one of copper, aluminum, tungsten, nickel, gold, tin, manganese, cobalt, titanium, tantalum, ruthenium, and beryllium or an alloy including the same. For example, the first interconnection pad 34 or the second interconnection pad 44 may include copper, but the embodiments are not limited thereto.

The first interconnection pad 34 may vertically overlap and/or contact the first interconnection member 142 to provide an electrical connection to an external circuit, an external device, or the like, and the second interconnection pad 44 may be vertically overlap and/or contact the second interconnection member 144 for an electrical connection to the external circuit, the external device, or the like. The first interconnection member 142 or the second interconnection member 144 may have a land shape, a ball shape, or a pin shape. The first interconnection member 142 or the second interconnection member 144 may include at least one of tin, lead, bismuth, silver, copper, aluminum, tungsten, nickel, manganese, cobalt, titanium, tantalum, ruthenium, beryllium, indium, molybdenum, magnesium, rhenium, and gallium or an alloy including the same.

For example, the first interconnection member 142 or the second interconnection member 144 may include tin or an alloy including tin (as an example, a Sn—Ag—Cu alloy). However, the embodiments are not limited thereto, and a shape, a material, or so on of the first interconnection member 142 or the second interconnection member 144 may be variously modified.

The semiconductor package 100 may be electrically connected to a package substrate by the first interconnection member 142, and the semiconductor package 100 may be electrically connected to another electronic component, semiconductor chip, or the like by the second interconnection member 144. However, the embodiments are not limited thereto, and various modifications are possible.

The intermediate redistribution portion 120, the first redistribution portion 30, and the second redistribution portion 40 may be electrically connected to each other to constitute a desirable circuit, thereby constituting a redistribution portion of the semiconductor package 100. The redistribution portion may perform various functions according to a design. For example, the redistribution portion may include a ground pattern, a power pattern, and a signal pattern. The signal pattern may be or include a pattern for transmitting various signals, e.g., data signals, or the like, except for signals applied to the ground pattern, the power pattern, or the like. The contact via 126, the first contact via 36, or the second contact via 46 included in the redistribution portion may include a contact via for ground, a contact via for power, a contact via for signal, or the like.

For example, the intermediate redistribution portion 120, the first redistribution portion 30, and the second redistribution portion 40 may form a fan-out structure that redistributes the pad 10*a* of the semiconductor chip 10 to a fan-out region, or electrically connect a plurality of chips constituting or in place of the semiconductor chip 10. For example, pads formed in the fan-out region may have different arrangement from the ones formed on the semiconductor chip 10, e.g., in a plan view. The fan-out region may be a region that does not overlap with the semiconductor chip 10 when viewed in a plan view. When the fan-out structure is formed by the redistribution portion, a region where the interconnection member 140 or the interconnection pad 24 connected to the interconnection member 140 may be larger than a region where the semiconductor chip 10 is positioned. For example, an area formed by a closed curve connecting outermost interconnection members 140 may be greater than an area of the semiconductor chip in a plan view. Thus, while reducing a size of the semiconductor chip 10, a sufficient number of the interconnection members 140 or the interconnection pads 24 may be provided. Interconnection members 140 disposed on interconnection pads 24 may be solder balls or solder bumps. However, the embodiments are not limited thereto, and various modifications are possible. As an example, the redistribution portion may form a fan-in structure.

For example, the semiconductor package 100 according to an embodiment may be a fan-out wafer level package (FOWLP) having a fan-out structure by using the redistribution portion. However, the embodiments are not limited thereto.

In FIG. 2, it is illustrated as an example that a length of the semiconductor chip 10 in a first direction (X-axis direction of the drawing) is the same as a length of the semiconductor chip 10 in a second direction (Y-axis direction of the drawing), a length of the semiconductor package 100 in the first direction (X-axis direction of the drawing) is the same as a length of the semiconductor package 100 in the second direction (Y-axis direction of the drawing), and the semiconductor chip 10 is at a center portion of the semiconductor package 100 for the semiconductor package 100 to have a symmetric structure. However, a shape of the semiconductor chip 10, a shape of the semiconductor package 100, or an arrangement of the semiconductor chip 10 may be variously modified. In FIG. 2, it is illustrated as an example that the second interconnection pad 44 is adjacent to an edge of the semiconductor package 100 and includes a plurality of second interconnection pads 44 at a regular interval along the edge of the semiconductor package 100. However, an arrangement of the first interconnection pad 34 or the second interconnection pad 44 may be variously modified.

In the embodiment, the redistribution portion 20 including the interconnection pad 24 may include the first redistribution portion 30 including the first interconnection pad 34 and the second redistribution portion 40 including the second interconnection pad 44. In the embodiment, the interconnection pad 24 may include an opening 24*a*. For brief explanation and clear understanding, it will be described later based on the interconnection pad 24, the inner insulation layer 28*a*, and the outer insulation layer 28*b*. Descriptions to the interconnection pad 24, the inner insulation layer 28*a*, and the outer insulation layer 28*b* may be respectively applied to the first interconnection pad 34, the first inner insulation layer 38*a*, and the first outer insulation layer 38*b*, and/or may be respectively applied to the second interconnection pad 44, the second inner insulation layer 48*a*, and the second outer insulation layer 48*b*.

In the embodiment, the interconnection pad 24 may be on the inner insulation layer 28*a*, and the outer insulation layer 28*b* may cover a part of the interconnection pad 24. For example, inner insulation layers 28*a* may include the first inner insulation layer 38*a* and the second inner insulation layer 48*a*, and outer insulation layers 28*b* may include the first and second outer insulation layers 38*b* and 48*b*. The outer insulation layer 28*b* may be referred to as a cover insulation layer or a solder mask layer. For example, the interconnection pad 24 may have a solder mask defined (SMD) structure. In this instance, the opening 24*a* may be at a region of the interconnection pad 24 covered by the outer insulation layer 28*b* (i.e., the second region A2), and the outer insulation layer 28*b* may fill at least a part of the opening 24*a*. For example, the outer insulation layer 28*b* may contact a sidewall of the opening 24*a*. This will be described in more detail with reference to FIG. 3, FIG. 4A, and FIG. 4B, along with FIG. 2.

Figure 3:
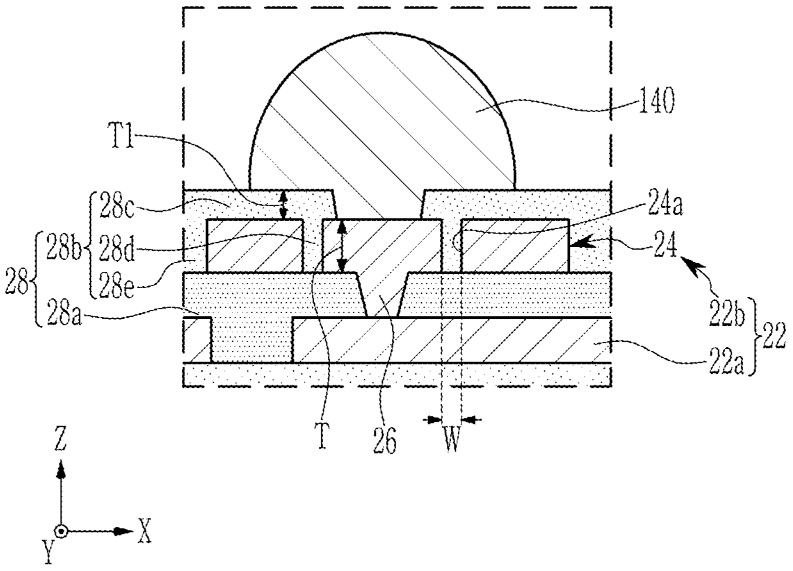
FIG. 3 is an enlarged cross-sectional view of a portion A of FIG. 1.
Figure 4A:
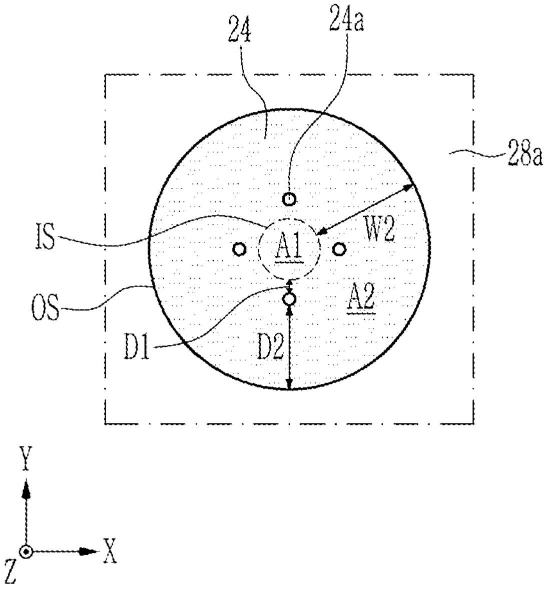
FIG. 4A and FIG. 4B show enlarged plan views illustrating an inner insulation layer, the interconnection pad, and an outer insulation layer included in the semiconductor package shown in FIG. 1.
Figure 4B:
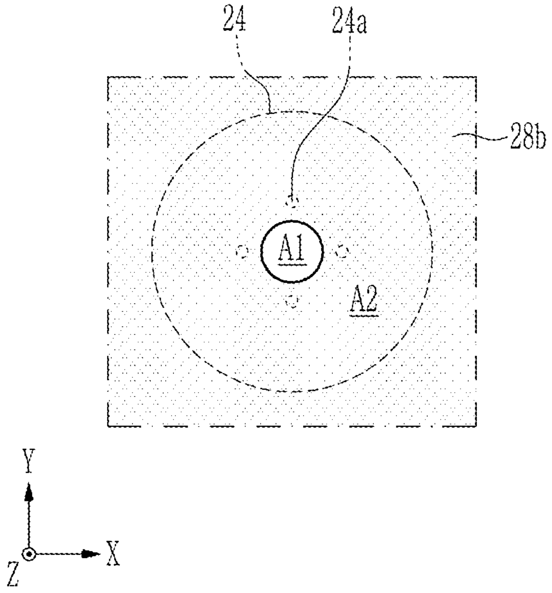

FIG. 3 is an enlarged cross-sectional view of a portion A of FIG. 1, and FIGS. 4A and 4B show enlarged plan views illustrating the inner insulation layer 28*a*, the interconnection pad 24, and the outer insulation layer 28*b* included in the semiconductor package 100 shown in FIG. 1. FIG. 4A illustrates the inner insulation layer 28*a* and the interconnection pad 24 on the inner insulation layer 28*a*, and FIG. 4B illustrates the outer insulation layer 28*b* on the inner insulation layer 28*a* and the interconnection pad 24.

Referring to FIG. 2, FIG. 3, FIG. 4A, and FIG. 4B, in the embodiment, an outer redistribution layer 22*b* positioned on the inner insulation layer 28*a* at an outside to be adjacent to the outer insulation layer 28*b* may include the interconnection pad 24. For reference, a redistribution layer other than the outer redistribution layer 22*b* may be referred to as an internal redistribution layer 22*a*. For example, the outer redistribution layer 22*b* may contact the outer insulation layer 28*b* on one surface and may contact the inner insulation layer 28*a* on another surface (e.g., on the opposite surface to the surface contacting the outer insulation layer 28*b*).

The interconnection pad 24 on the inner insulation layer 28*a* may include a first region A1, and a second region A2 at an outside of the first region A1 and having the opening 24*a*. In this case, the first region A1 may be a central region or an internal region, and the second region A2 may be an edge region. The outer insulation layer 28*b* may include a first portion 28*c* on the second region A2 of the interconnection pad 24, and a second portion 28*d* filling at least a part of the opening 24*a*. The outer insulation layer 28*b* may further include a third portion 28*e* at an outside of the interconnection pad 24 on (e.g., directly on) the inner insulation layer 28*a*. For example, the first region A1 of the interconnection pad 24 may be a portion which does not vertically overlap the outer insulation layer 28*b*, and the second region A2 of the interconnection pad 24 may be a portion vertically overlapping the outer insulation layer 28*b* (e.g., the first portion 28*c*). For example, the third portion 28*e* of the outer insulation layer 28*b* may surround the second region A2 of the interconnection pad 24 and the first portion 28*c* of the outer insulation layer 28*b* in a plan view.

In an embodiment, the opening 24*a* may penetrate the interconnection pad 24. For example, the opening 24*a* may pass through the interconnection pad 24 from a bottom surface to a top surface of the interconnection pad 24. The opening 24*a* may be on the inner insulation layer 28*a*, and may be at a portion where the contact via 26 connected to the interconnection pad 24 is not positioned. For example, the opening 24*a* may not vertically overlap the contact via 26.

In a cross-sectional view, the second portion 28*d* may include a portion filling an entire portion of the opening 24*a* in a thickness direction (e.g., a vertical direction). Accordingly, the second portion 28*d* of the outer insulation layer 28*b* may be directly connected to or be in contact with the inner insulation layer 28*a*, e.g., at a bottom of the opening 24*a*. For example, a bottom surface of the second portion 28*d* in the opening 24*a* may be directly connected to or be in contact with the inner insulation layer 28*a*. In a plan view, the second portion 28*d* of the outer insulation layer 28*b* may fill an entire portion of the opening 24*a*. For example, the second portion 28*d* of the outer insulation layer 28*b* may fill an entire portion of an inner space of the opening 24*a*.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

However, the embodiments are not limited thereto. As an example, in a cross-sectional view, the second portion 28*d* may fill a part of the opening 24*a*, or the second portion 28*d* may not be directly connected to or not be in contact with the inner insulation layer 28*a*. The second portion 28*d* may fill a part of the inner space of the opening 24*a*. In some embodiments, the opening 24*a* may not penetrate the interconnection pad 24 in a thickness direction (e.g., in the vertical direction). Other various modifications are possible.

When the interconnection pad 24 includes the opening 24*a* and the outer insulation layer 28*b* fills at least a part of the opening 24*a* in a solder mask defined (SMD) structure, a contact area between the interconnection pad 24 and the outer insulation layer 28*b* may be increased, and thus, adhesion force between the interconnection pad 24 and the outer insulation layer 28*b* may be enhanced. The outer insulation layer 28*b* may be directly connected to or be in contact with the inner insulation layer 28*a* through the opening 24*a*. Since adhesion force between the outer insulation layer 28*b* and the inner insulation layer 28*a* is larger/ stronger than the adhesion force between the outer insulation layer 28*b* and the interconnection pad 24, the outer insulation layer 28*b* may be stably disposed on the interconnection pad 24 by superior adhesion force between the outer insulation layer 28*b* and the inner insulation layer 28*a*. Accordingly, peeling of the outer insulation layer 28*b* from the interconnection pad 24 may be prevented or suppressed, and a crack initiation or propagation at the inner insulation layer 28*a* may be prevented or suppressed.

By a structure that the interconnection pad 24 includes the opening 24*a*, the peeling of the outer insulation layer 28*b* and the interconnection pad 24 and the crack at the inner insulation layer 28*a* may be effectively prevented or suppressed. For example, a material change of the interconnection pad 24, the inner insulation layer 28*a*, or the outer insulation layer 28*b* for enhancing the adhesion force may not be necessary, thereby reducing a manufacturing cost.

On the other hand, in the conventional art, adhesion force between an interconnection pad including a metal and an outer insulation layer including an insulating material is low/weak, and thus, peeling of the outer insulation layer on the interconnection pad from the interconnection pad may occur. If the outer insulation layer was peeled from the interconnection pad, a crack initiation or propagation at an inner insulation layer may occur.

In an embodiment, the first portion 28*c* and the second portion 28*d* of the outer insulation layer 28*b* may have an integral structure in which the first portion 28*c* and the second portion 28*d* includes the same material and the first portion 28*c* and the second portion 28*d* are continuously formed, e.g., as one body. As an example, the first portion 28*c* and the second portion 28*d* of the outer insulation layer 28*b* may be a single layer, a single insulation layer, or a single insulation portion continuously formed. For example, the first portion 28*c* and the second portion 28*d* may be formed by the same process. Therefore, the outer insulation layer 28*b* including the first portion 28*c* and the second portion 28*d* may be formed by a relatively easy process. In this instance, the third portion 28*e* may have an integral structure with the first portion 28*c* and the second portion 28*d*.

In an embodiment, a diameter or a width of the opening 24*a*, e.g., in a horizontal direction, may be the same as or larger than a thickness T of the interconnection pad 24, e.g., in the vertical direction. Then, the opening 24*a* has a relatively large size, and a contact area between the outer insulation layer 28*b* and the inner insulation layer 28*a* may be sufficiently secured. Accordingly, the peeling of the outer insulation layer 28*b* from the interconnection pad 24 may be effectively prevented or suppressed. In some embodiments, the diameter or the width of the opening 24*a*, e.g., in a horizontal direction, may be smaller than the thickness T of the interconnection pad 24, e.g., in the vertical direction. Then, the thickness T of the interconnection pad 24 is relatively large, the interconnection pad 24 may be stably formed and the interconnection pad 24 may have low electrical resistance. As an example, the diameter or width of the opening 24*a* may be the largest diameter or width of the opening 24*a*, e.g., in a horizontal direction, and the thickness of the interconnection pad 24 may be the smallest thickness of the interconnection pad 24, e.g., in the vertical direction.

In some embodiments, the diameter or the width of the opening 24*a* may be 1 μm to 40 um. If the diameter or the width of the opening 24*a* is less than 1 μm, the peeling of the outer insulation layer 28*b* from the interconnection pad 24 may not be sufficiently prevented or suppressed. If the diameter or the width of the opening 24*a* is larger than 40 um, electrical property of the interconnection pad 24 may be deteriorated. However, the embodiments are not limited thereto, the diameter or the width of the opening 24*a* may be variously changed.

As an example, the diameter or the width W of the opening 24*a* may be the same as or larger than a thickness of the first portion 28*c*. Then, the opening 24*a* has a relatively large size, and a contact area between the outer insulation layer 28*b* and the inner insulation layer 28*a* may be sufficiently secured. Accordingly, the peeling of the outer insulation layer 28*b* from the interconnection pad 24 may be effectively prevented or suppressed. In some embodiments, the diameter or the width W of the opening 24*a* may be smaller than the thickness of the first portion 28*c*. Then, the thickness T1 of the first portion 28*c* is relatively large, and the outer insulation layer 28*b* may stably cover the interconnection pad 24. As an example, the thickness T1 of the first portion 28*c* may be the smallest thickness of the first portion 28*c*, e.g., in the vertical direction.

In an embodiment, the interconnection pad 24 may include a plurality of openings 24*a*. Then, the peeling of the outer insulation layer 28*b* from the interconnection pad 24 may be effectively prevented or suppressed by the plurality of openings 24*a*. However, the embodiments are not limited thereto, and the interconnection pad 24 may include only one opening 24*a* in certain embodiments.

In this instance, the opening 24*a* may have a closed shape, an island shape, or a dot shape in which an outer side surface of the opening 24*a* is entirely surrounded by a conductive material of the interconnection pad 24. Accordingly, the opening 24*a* may be partially positioned in each of a first direction (X-axis direction in the drawing), a second direction (Y-axis direction in the drawing), a radius direction of the interconnection pad 24, and a circumferential direction of the interconnection pad 24. For example, the interconnection pad 24 may have a circular shape in a plan view. In the other portion of the interconnection pad 24 except for the opening 24*a*, the conductive material of the interconnection pad 24 may be positioned.

Unlike the above, the opening 24*a* may extend along one direction (e.g., the circumferential direction), and the contact area between the interconnection pad 24 and the outer insulation layer 28*b* with relatively small/weak adhesion force may be increased to a certain level. Thus, the interconnection pad 24 and the outer insulation layer 28*b* may not be stably adhered. Further, an area of the opening 24*a* may be relatively large, and thus, electrical property of the interconnection pad 24 may be deteriorated. However, the embodiments are not limited thereto.

In an embodiment, the plurality of openings 24*a* may be spaced apart from each other at a regular interval to have a symmetrical arrangement/structure. For example, the plurality of openings 24*a* may be spaced apart from an inner edge IS of the second region A2 by the same distance and may be spaced apart from an outer edge OS of the second region A2 by the same distance. The plurality of openings 24*a* may be spaced apart from each other at a regular interval in the circumferential direction. Then, the plurality of openings 24*a* may be arranged uniformly in the interconnection pad 24. Accordingly, the peeling of the outer insulation layer 28*b* from the interconnection pad 24 may be effectively prevented or suppressed by assigning a small area for the plurality of openings 24*a*. However, the embodiments are not limited thereto, and an arrangement of the plurality of openings 24*a* or so on may be variously changed. This will be described later in more detail with reference to FIG. 6A to FIG. 6D, FIG. 7, and FIG. 8.

In an embodiment, a first area may be smaller than a second area. The first area is a total area (e.g., in a plan view) of a portion where the opening 24*a* or the openings 24*a* are positioned (e.g., occupy) in the second region A2 (i.e., a total area of one or the plurality of openings 24*a* at each interconnection pad 24). The second area is a total area (e.g., in a plan view) of a portion where the opening 24*a* or the openings 24*a* are not positioned (e.g., does not occupy) in the second region A2. Then, deterioration of electric property of the interconnection pad 24 that may occur by a relatively large area of the opening 24*a* may be prevented or suppressed. As an example, the first area may be 1% or more and less than 50% of a total area of the second region A2. If the first area is less than 1% of the total area of the second region A2, the peeling of the outer insulation layer 28*b* from the interconnection pad 24 may not be sufficiently prevented or suppressed. If the first area is 50% of the total area of the second region A2 or more, the area of the opening 24*a* may be too big and thus electrical property of the interconnection pad 24 may be deteriorated. However, the embodiments are not limited thereto. Therefore, the first area may be the same as or larger than the second area. Also, the first area may be less than 1% of the total area of the second region A2, or larger than 50% of the total area of the second region A2 in certain embodiments.

In an embodiment, the opening 24*a* may be spaced apart from the inner edge IS of the second region A2 and the opening 24*a* may be spaced apart from the outer edge OS of the second region A2. Then, the opening 24*a* may be stably/securely positioned at an inside of the second region A2, and the outer insulation layer 28*b* at the second region A2 may stably fill an entire portion of the opening 24*a*.

For example, a first distance D1 shown in FIG. 4A may be 1% to 90% of a width W2 of the second region A2 as shown in FIG. 4A. Here, the width W2 of the second region A2 may be a distance between the inner edge IS of the second region A2 and the outer edge OS of the second region A2. As an example, the width W2 of the second region A2 may be the smallest/closest distance between the inner edge IS of the second region A2 and the outer edge OS of the second region A2. The first distance D1 is a distance between the opening 24*a* and the inner edge IS of the second region A2. As an example, the first distance D1 may be the smallest/closest distance between the opening 24*a* and the inner edge IS of the second region A2. Then, the outer insulation layer 28*b* may stably fill an entire portion of the opening 24*a* in the second region A2, and the peeling of the outer insulation layer 28*b* from the interconnection pad 24 may be prevented or suppressed.

As an example, the first distance D1 may be smaller/shorter than a second distance D2. Here, the second distance D2 is a distance between the opening 24*a* and the outer edge OS of the second region A2. As an example, the second distance D2 may be the smallest/closest distance between the opening 24*a* and the outer edge OS of the second region A2. For example, the opening 24*a* may be adjacent to the inner edge IS or closer to the inner edge IS than the outer edge OS. This is because the peeling of the outer insulation layer 28*b* from the interconnection pad 24 may easily occur at a portion adjacent to the inner edge IS of the second region A2 where an edge of the outer insulation layer 28*b* is positioned.

In some embodiments, the first distance D1 may be 1% to 50% (e.g., 5% to 50%) of the width W2 of the second region A2. Then, the peeling of the outer insulation layer 28*b* from the interconnection pad 24 that may occur at the portion adjacent to the inner edge IS of the second region A2 where an edge portion of the outer insulation layer 28*b* is positioned may be effectively prevented or suppressed.

However, the embodiments are not limited thereto. In some embodiments, the first distance D1 may be the same as or larger than the second distance D2. Also, the first distance D1 may be less than 1% (e.g., less than 5%) or larger than 50% of the width W2 of the second region A2.

According to the embodiment, the peeling of the outer insulation layer 28*b* from the interconnection pad 24 and the crack initiation or propagation at the inner insulation layer 28*a* may be prevented or suppressed by improving structures of the interconnection pad 24 and the outer insulation layer 28*b*. For example, the outer insulation layer 28*b* includes the second portion 28*d* that is a connection portion penetrating a part of the interconnection pad 24 to be connected to (e.g., contact) the inner insulation layer 28*a*, and thus, the peeling of the outer insulation layer 28*b* from the interconnection pad 24 and the crack initiation or propagation at the inner insulation layer may be prevented or suppressed. Accordingly, a defect of the semiconductor package 100 or the wiring substrate may be reduced and reliability of the semiconductor package or the wiring substrate may be enhanced.

In FIG. 2, it is illustrated as an example that the interconnection pad 24 has a circular shape, the first region A1 has a circular shape, and the second region A2 is a ring shape or an annular shape formed along an edge of the first region A1 in a plan view. However, the embodiments are not limited thereto. A shape or so on of the interconnection pad 24, the first region A1, or the second region A2 may be variously modified.

In FIG. 2, it is illustrated as an example that each of the plurality of interconnection pads 24 of the semiconductor package 100 includes four corresponding openings 24*a*. However, the embodiments are not limited thereto, and at least one of the plurality of interconnection pads 24 may include at least one opening 24*a*, and the other of the plurality of interconnection pads 24 may not include an opening 24*a* in certain embodiments. In FIG. 2, it is illustrated as an example that the plurality of interconnection pads 24 includes the openings 24*a* having the same shape and the same arrangement. However, the embodiments are not limited thereto, and shapes, arrangements, or so on of the openings 24*a* in the plurality of interconnection pads 24 may be different from each other.

In FIG. 2, it is illustrated as an example that the second interconnection pad 44 includes the opening 24*a*. In some embodiments, the first interconnection pad 34 may include openings 24*a* the same as the opening 24*a* illustrated in FIG. 2. In some embodiments, an interconnection pad included in one of various wiring substrates of the semiconductor package 100 may include one or more openings the same as the opening 24*a*, and an outer insulation layer may fill the openings. In the above description, the redistribution portion 20 including the interconnection pad 24 includes the first redistribution portion 30 and the second redistribution portion 40 in the semiconductor package 100 as an example. In some embodiments, the semiconductor package 100 may include one of the first redistribution portion 30 and the second redistribution portion 40 and may not include the other. In the above description, the inner insulation layer 28*a* and the outer insulation layer 28*b* are included in the first redistribution portion 30 and/or the second redistribution portion 40 as an example. In some embodiments, at least one of the inner insulation layer 28*a* and the outer insulation layer 28*b* may be included in the intermediate redistribution portion 120.

In the above embodiment, the semiconductor package 100 includes an application process as an example, but the embodiments are not limited thereto. The semiconductor package 100 may have various structures, types, schemes, or so on.

A manufacturing method of a semiconductor package 100 will be described in detail with reference to FIG. 5A to FIG. 5E. A manufacturing method of a semiconductor package 100 according to an embodiment may include a manufacturing method of a redistribution portion 20, a redistribution substrate, a wiring substrate, and/or a connection substrate.

FIG. 5A to FIG. 5E are cross-sectional views schematically illustrating a manufacturing method of the semiconductor package 100 shown in FIG. 1. A portion corresponding to portion A of FIG. 1 is illustrated in FIG. 5A to FIG. 5E, and a manufacturing method of the portion A of FIG. 1 is mainly described in the below description. To the extent that an element is not described in detail below, it may be understood that the element is at least similar to or the same as a corresponding element that has been described elsewhere within the present disclosure. Portions/features which has been described above may not be duplicated below, and portions/features which are not described above will be mainly described in detail below.

Figure 5A:
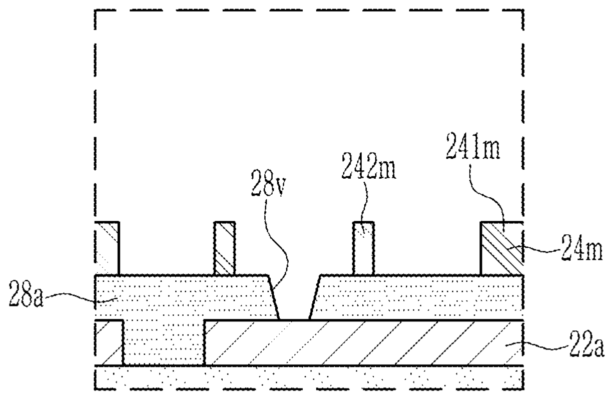
FIG. 5A to FIG. 5E are cross-sectional views schematically illustrating a manufacturing method of the semiconductor package shown in FIG. 1.

As shown in FIG. 5A, a mask layer 24*m* is formed on an inner insulation layer 28*a*. The mask layer 24*m* may be positioned at a portion other than a portion where an interconnection pad 24 (refer to FIG. 5B) will be positioned. For example, the mask layer 24*m* may include a first mask portion 241*m* and a second mask portion 242*m*. The first mask portion 241*m* may be positioned at a portion other than a portion where an outer redistribution layer 22*b* (refer to FIG. 5E) including the interconnection pad 24 will be positioned. The first mask portion 241*m* may be positioned at a portion where a third portion 28*e* (refer to FIG. 5E) of an outer insulation layer 28 (refer to FIG. 5E) will be positioned. The second mask portion 242*m* may be formed at a portion where an opening 24*a* (refer to FIG. 5G) of the interconnection pad 24 will be positioned.

For example, the mask layer 24*m* may include a photosensitive material, and the mask layer 24*m* may be patterned by pattering through a photoresist process (e.g., an exposure process and/or a developing process). However, the embodiments are not limited thereto. The mask layer 24*m* may be formed in a state having a pattern, and/or the mask layer 24*m* may not include a photosensitive material. Other various modifications are possible.

In FIG. 5A, it is illustrated as an example that the mask layer 24*m* is formed on the inner insulation layer 28*a* having a through via 28*v*, but the embodiments are not limited thereto. The mask layer 24*m* may be formed on the inner insulation layer 28*a* in a state that a contact via 26 (refer to FIG. 5B) is positioned in the through via 28*v* of the inner insulation layer 28*a*. For example, the mask layer 24*m* may be formed after the contact via 26 is formed in the through via 28*v* in certain embodiments.

Figure 5B:
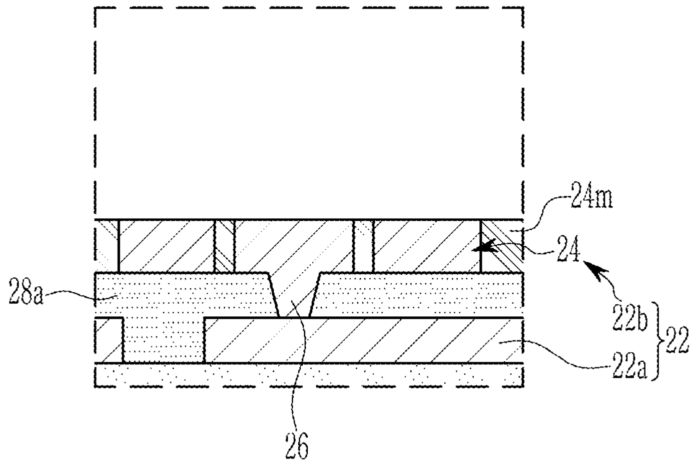

Next, as shown in FIG. 5B, an outer redistribution layer 22*b* including an interconnection pad 24 may be formed on a portion where the mask layer 24*m* is not formed.

The outer redistribution layer 22*b* including the interconnection pad 24 may be formed by any of various methods. For example, the outer redistribution layer 22*b* may be formed by a plating process using the mask layer 24*m*. By the plating process, the outer redistribution layer 22*b* having a desired shape may be formed at a desired position by a relatively simple process.

Figure 5C:
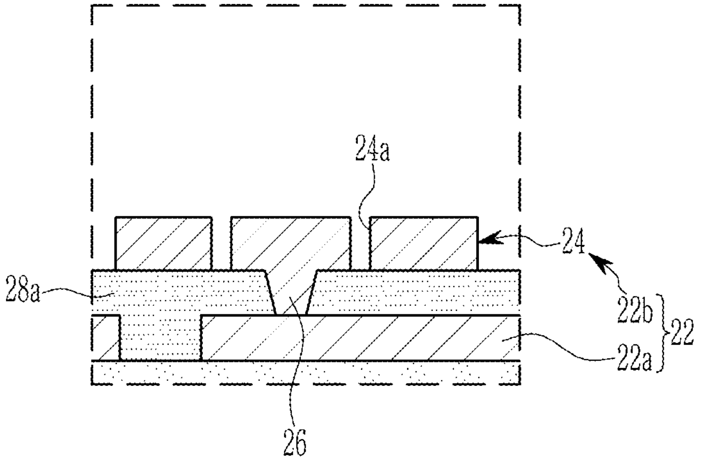

Next, as shown in FIG. 5C, the mask layer 24*m* may be removed. Then, an opening 24*a* of the interconnection pad 24 may be positioned at a portion where the second mask portion 242*m* (refer to FIG. 5A) was positioned. The mask layer 24*m* may be removed by any of various processes, such as, an etching process or so on.

Figure 5D:
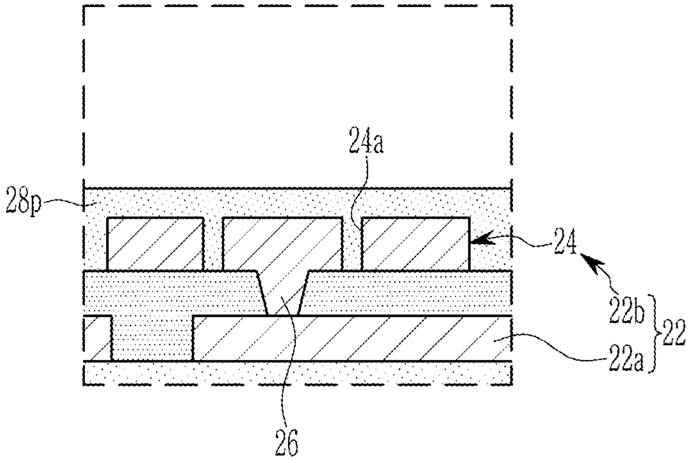
Figure 5E:
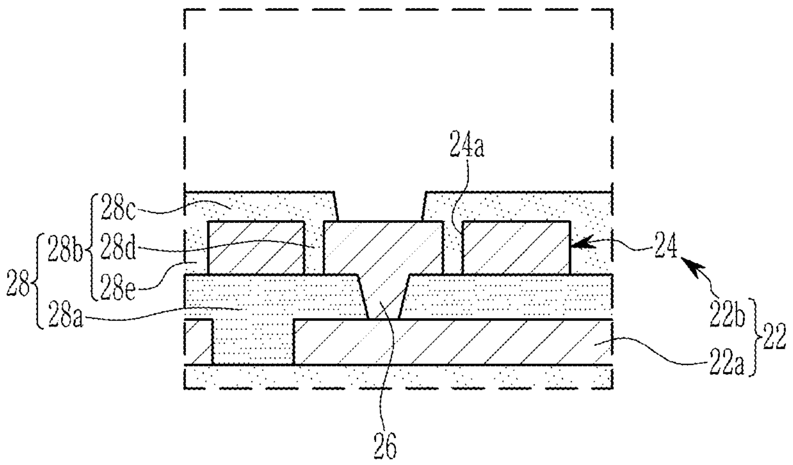

Next, an insulating material layer 28*p* may be formed to cover the inner insulation layer 28*a* and the interconnection pad 24 as shown in FIG. 5D, and a part of the insulating material layer 28*p* may be removed to expose a first region of the interconnection pad 24 to form an outer insulation layer 28*b* as shown in FIG. 5E.

For example, the insulating material layer 28*p* may be entirely formed on the inner insulation layer 28*a* and the interconnection pad 24 to fill a portion where the mask layer 24*m* was removed. The insulating material layer 28*p* may be formed by any of various methods, such as, coating, deposition, or so on. The removed part of the insulating material layer 28*p* may be removed by any of various processes, such as, a photolithography process or so on. When the insulating material layer 28*p* or the outer insulation layer 28*b* includes a photosensitive material (e.g., PID), the insulating material layer 28*p* or the outer insulation layer 28*b* may be easily patterned by a photolithography process. However, the embodiments are not limited thereto, and the outer insulation layer 28*b* may be formed by various methods.

Hereinafter, a semiconductor package and a wiring substrate included in the same according to an embodiment will be described with reference to FIG. 6A to FIG. 6D, and FIG. 7 to FIG. 9. To the extent that is not described in detail below, it may be understood that each element is at least similar to or the same as a corresponding element that has been described elsewhere within the present disclosure. Portions/features which are not described above will be mainly described in detail below.

FIG. 6A to FIG. 6D show partial plan views illustrating various examples of an interconnection pad included in a semiconductor package according to a modified embodiment. A portion corresponding to FIG. 4A is illustrated in FIG. 6A to FIG. 6D.

Figure 6A:
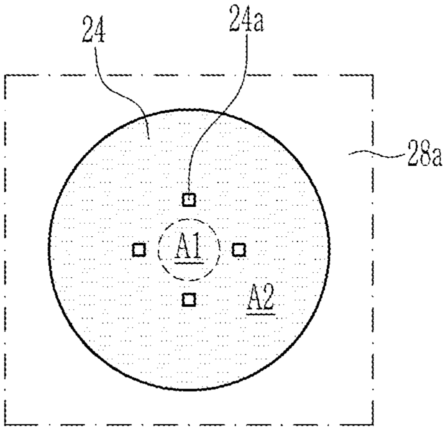
FIG. 6A to FIG. 6D show partial plan views illustrating various examples of an interconnection pad included in a semiconductor package according to modified embodiments.
Figure 6B:
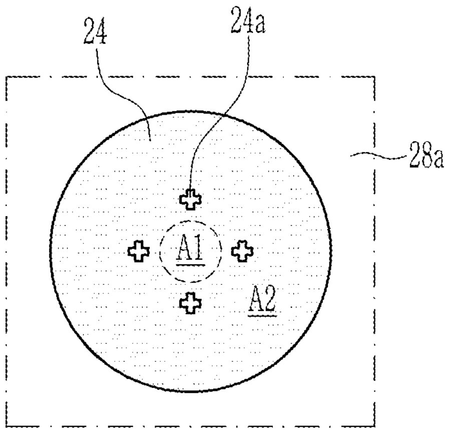

Referring to FIG. 6A, an opening 24*a* of an interconnection pad 24 according to a modified embodiment may have a quadrangle shape. Referring to FIG. 6B, an opening 24*a* of an interconnection pad 24 according to a modified embodiment has a shape including a first portion extending lengthwise in a horizontal direction and a second portion in another direction crossing the direction (e.g., in a perpendicular direction). For example, the opening 24*a* of the interconnection pad 24 may have a cross shape. As such, the opening 24*a* of the interconnection pad 24 may have a different shape from an outer edge of the interconnection pad 24. For the sake of illustration, the opening 24*a* of the interconnection pad 24 has the quadrangle shape or the cross shape, e.g., in a plan view, but the opening 24*a* of the interconnection pad 24 may have any of various other shapes.

Figure 6C:
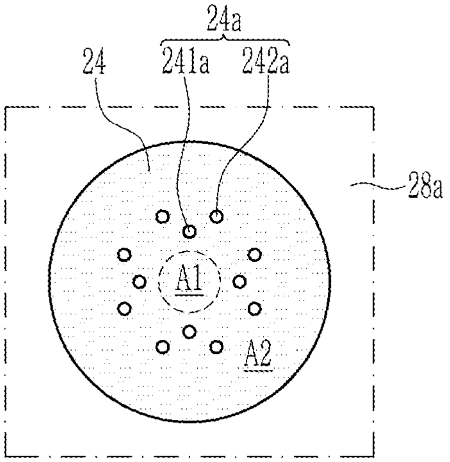

Referring to FIG. 6C, openings 24*a* of an interconnection pad 24 according to a modified embodiment may include a first opening 241*a* spaced apart from a center of the interconnection pad 24 by a first distance, e.g., in a horizontal direction, and a second opening 242*a* spaced from the center of the interconnection pad 24 by a second distance (e.g., in a horizontal direction) different from the first distance. A plurality of openings 24*a* are provided in various positions to effectively prevent or suppress peeling of an outer insulation layer from the interconnection pad 24.

In FIG. 6C, it is illustrated as an example that a plurality of first openings 241*a* is formed in the interconnection pad 24 and a plurality of second openings 242*a* is formed in the interconnection pad 24. However, the embodiments are not limited thereto. For example, only one first opening 241*a* may be included in the interconnection pad 24, and/or only one second opening 242*a* may be included in the interconnection pad 24 in certain embodiments.

In FIG. 6C, it is illustrated as an example that the plurality of first openings 241*a* are spaced apart from each other at a regular interval in a circumferential direction to have a symmetrical structure, and the plurality of second openings 242*a* are spaced apart from each other at a regular interval in a circumferential direction to have a symmetrical structure. However, the embodiments are not limited thereto, and an arrangement of the plurality of first openings 241*a*, an arrangement of the plurality of second openings 242*a*, or so on may be variously modified.

In FIG. 6(*c*), it is illustrated as an example that the first opening 241*a* and the second opening 242*a* have the same shape, but the embodiments are not limited thereto. The first opening 241*a* and the second opening 242*a* may have different shapes from each other. In some embodiments, the plurality of first openings 241*a* may have different shapes from each other, and/or the plurality of second openings 242*a* may have different shapes from each other. It is illustrated as an example that the first and second openings 241*a* and 242*a* have the same circular shape as the interconnection pad 24. For example, the first and second openings 241*a* and 242*a*, and the interconnection pad 24 have circular shapes in FIG. 6C. At least one of the first and second openings 241*a* and 242*a* may have a different shape from the interconnection pad 24 in certain embodiments. As an example, the first opening 241*a* and/or the second opening 242*a* may have any of shapes shown in FIG. 6A and FIG. 6B. In addition, a number, a shape, and so on of the first opening 241*a* and the second opening 242*a* may be variously modified.

Figure 6D:
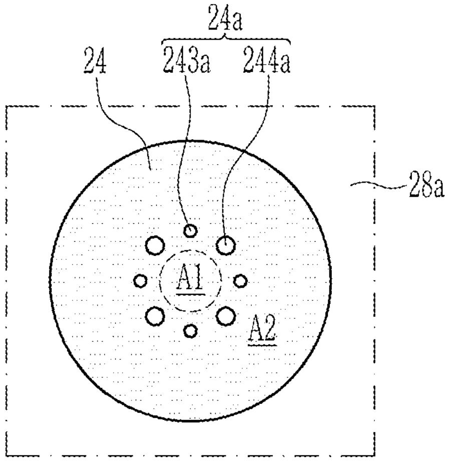

Referring to FIG. 6D, openings 24*a* of an interconnection pad 24 according to a modified embodiment may include a first opening 243*a* having a first size and a second opening 244*a* having a second size different from the first size. For example, a plurality of openings 24*a* having various sizes are provided to effectively prevent or suppress peeling of an outer insulation layer from the interconnection pad 24 in the embodiment shown in FIG. 6D.

In FIG. 6D, it is illustrated as an example that a plurality of first openings 243*a* is formed in the interconnection pad 24 and a plurality of second openings 244*a* is formed in the interconnection pad 24. However, the embodiments are not limited thereto. For example, only one first opening 243*a* may be included/formed in the interconnection pad 24, and/or only one second opening 244*a* may be included/formed in the interconnection pad 24 in certain embodiments.

In FIG. 6D, it is illustrated as an example that the plurality of first openings 243*a* are spaced apart from each other at a regular interval in a circumferential direction to have a symmetrical structure, and the plurality of second openings 244*a* are spaced apart from each other at a regular interval in a circumferential direction to have a symmetrical structure. However, the embodiments are not limited thereto, and an arrangement of the plurality of first openings 243*a*, an arrangement of the plurality of second openings 244*a*, or so on may be variously modified.

In FIG. 6(*d*), it is illustrated as an example that the first opening 243*a* and the second opening 244*a* have the same shape (e.g., both have circular shapes), but the embodiments are not limited thereto. The first opening 243*a* and the second opening 244*a* may have different shapes from each other. In some embodiments, the plurality of first openings 243*a* may have different shapes from each other, and/or the plurality of second openings 244*a* may have different shapes from each other. It is illustrated as an example that the first and second openings 243*a* and 244*a* have the same circular shape as the interconnection pad 24. For example, the first and second openings 243*a* and 244*a*, and the interconnection pad 24 have circular shapes in FIG. 6D. At least one of the first and second openings 243*a* and 244*a* may have a different shape from the interconnection pad 24 in certain embodiments. As an example, the first opening 243*a* and/or the second opening 244*a* may have any of shapes shown in FIG. 6A and FIG. 6B. In addition, a number, a shape, and so on of the first opening 243*a* and the second opening 244*a* may be variously modified.

Unless otherwise described, the modification of the embodiment referring to FIG. 1 to FIG. 3, FIG. 4A, FIG. 4B, and FIG. 5A to FIG. 5E may be applied to the embodiment referring to FIG. 6A to FIG. 6D.

Figure 7:
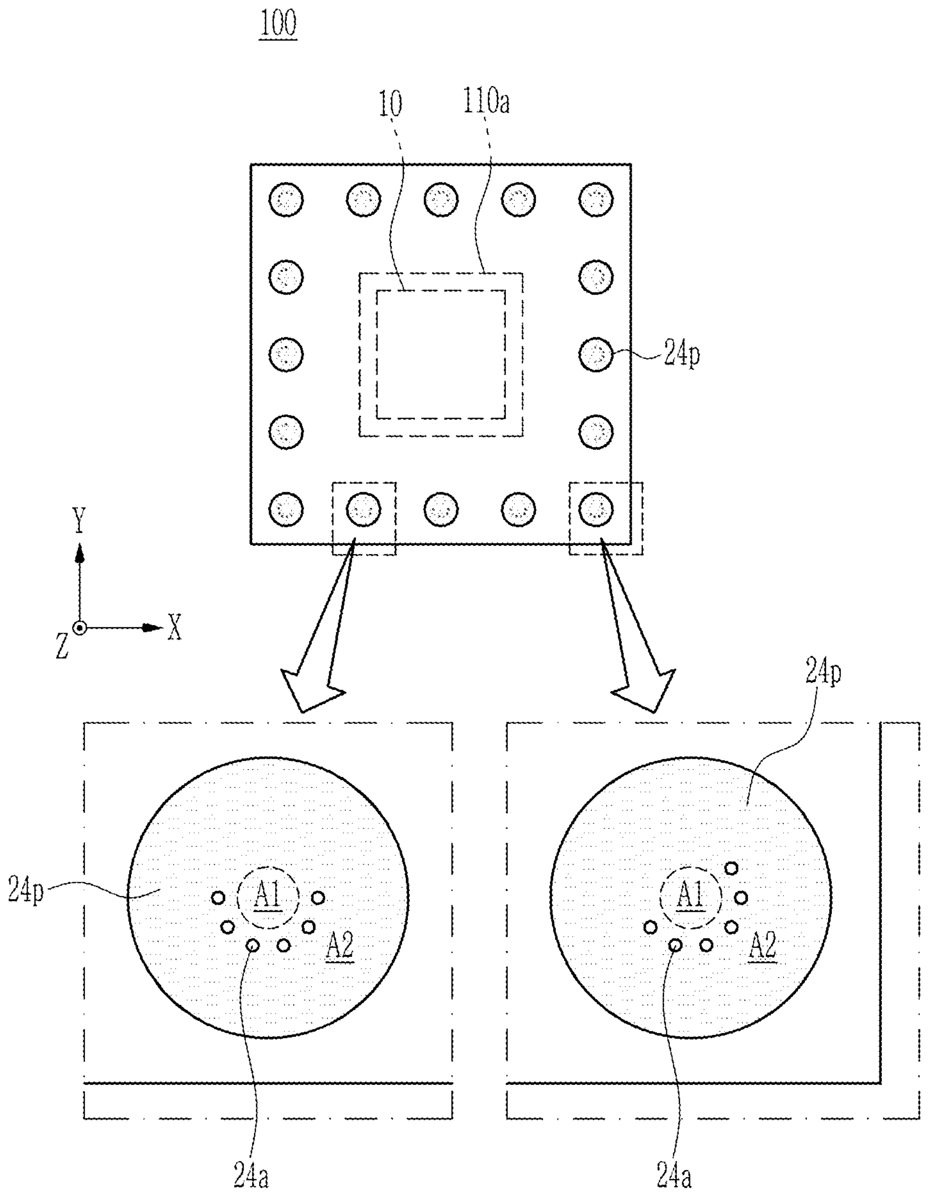
FIG. 7 is a plan view of a semiconductor package according to an embodiment.

FIG. 7 is a plan view of a semiconductor package 100 according to an embodiment. A portion corresponding to FIG. 2 is illustrated in FIG. 7.

Referring to FIG. 7, a semiconductor package 100 according to an embodiment may include an outer interconnection pad 24*p* adjacent to an edge or a corner of the semiconductor package 100, e.g., in a plan view.

In the outer interconnection pad 24*p*, openings 24*a* may be locally or partially positioned in a portion adjacent to the edge or the corner of the semiconductor package 100. For example, as shown in a left enlarged view of FIG. 7, in an outer interconnection pad 24*p* adjacent to one edge of the semiconductor package 100, a plurality of openings 24*a* may be locally or partially positioned at a portion adjacent to the one edge, and may not be positioned at a portion opposite to the one edge. For example, as shown in a right enlarged view of FIG. 7, in an outer interconnection pad 24*p* adjacent to one corner of the semiconductor package 100, a plurality of openings 24*a* may be locally or partially positioned at a portion adjacent to the one corner, and may not be positioned at a portion opposite to the one corner. For example, the openings 24*a* may be asymmetrically arranged in the outer interconnection pad 24*p* with respect to a center of the outer interconnection pad 24*p*.

On the outer interconnection pad 24*p*, the outer insulation layer may be easily detached/peeled in the portion adjacent to the edge and/or the corner compared to other portions due to stress applied to the portion adjacent to the edge and/or the corner of the semiconductor package 100, and the openings 24*a* positioned/arranged as described above may effectively prevent or suppress the detachment/peeling. For example, the detachment/peeling of the outer insulation layer from the outer interconnection pad 24*p* may be effectively prevented or suppressed in the embodiments described above, considering the stress applied to the semiconductor package 100. Accordingly, defects of the semiconductor package 100 may be reduced/prevented and reliability of the semiconductor package 100 may be enhanced.

In FIG. 7, it is illustrated as an example that the outer interconnection pad 24*p* includes a plurality of openings 24*a* spaced apart from each other at an interval. However, the embodiments are not limited thereto. For example, only one opening 24*a* may be formed in the outer interconnection pad 24*p* in certain embodiments.

In FIG. 7, it is illustrated as an example that each of the plurality of interconnection pads 24 of the semiconductor package 100 includes the openings 24*a*. However, the embodiments are not limited thereto, and at least one of the plurality of outer interconnection pads 24*p* may include at least one opening 24*a*, and the other of the plurality of outer interconnection pads 24*p* may not include any opening 24*a* in certain embodiments. In FIG. 7, it is illustrated as an example that the plurality of outer interconnection pads 24*p* includes the openings 24*a* having the same shape and the same arrangement. However, the embodiments are not limited thereto, and shapes, arrangements, or so on of the openings 24*a* in the plurality of interconnection pads 24 may be different from each other in certain embodiments.

In FIG. 7, it is illustrated as an example that the interconnection pads include the outer interconnection pads 24*p*. In some embodiments, the interconnection pads may include an interconnection pad other than the outer interconnection pads 24*p*. For example, the interconnection pads of the embodiment illustrated in FIG. 7 are arranged in single file along the edge of the semiconductor package 100, but may be arranged in two or more rows in certain embodiments.

Unless otherwise described, the modification of the above embodiments and modified embodiments may be applied to the embodiment referring to FIG. 7.

Figure 8:
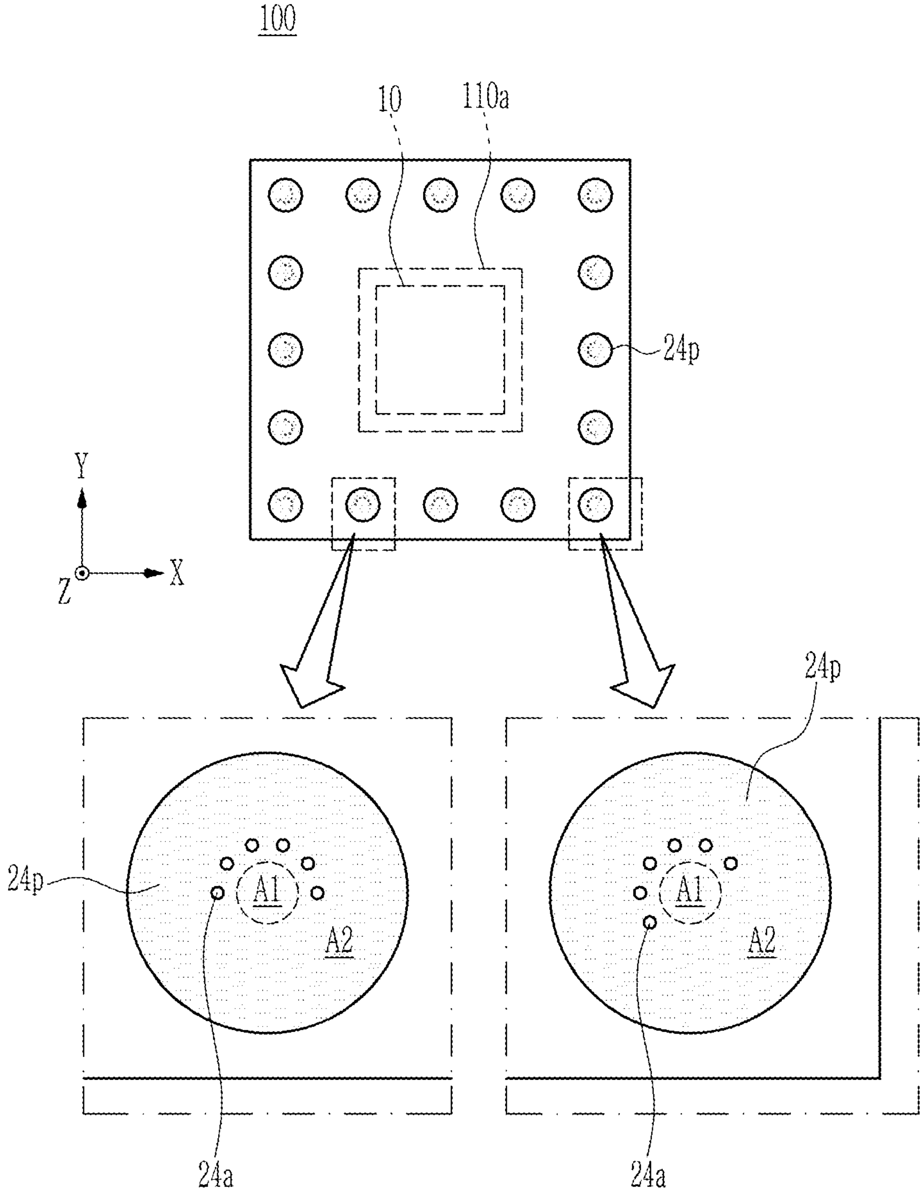
FIG. 8 is a plan view of a semiconductor package according to an embodiment.

FIG. 8 is a plan view of a semiconductor package according to an embodiment. A portion corresponding to FIG. 2 is illustrated in FIG. 8.

Referring to FIG. 8, a semiconductor package 100 according to an embodiment may include an outer interconnection pad 24*p* adjacent to an edge or a corner of the semiconductor package 100.

In the outer interconnection pad 24*p*, openings 24*a* may be locally or partially positioned in a portion opposite to the edge or the corner of the semiconductor package 100. For example, as shown in a left enlarged view of FIG. 8, in an outer interconnection pad 24*p* adjacent to one edge of the semiconductor package 100, a plurality of openings 24*a* may be locally or partially positioned at a portion opposite to the one edge, and may not be positioned at a portion adjacent to the one edge. For example, as shown in a right enlarged view of FIG. 8, in an outer interconnection pad 24*p* adjacent to one corner of the semiconductor package 100, a plurality of openings 24*a* may be locally or partially positioned at a portion opposite to the one corner, and may not be positioned at a portion adjacent to the one corner. For example, the openings 24*a* may be asymmetrically arranged in the outer interconnection pad 24*p* with respect to a center of the outer interconnection pad 24*p*.

On the outer interconnection pad 24*p*, the outer insulation layer may be easily detached/peeled in the portion opposite to the edge or the corner compared to other portions due to stress applied to the portion opposite to the edge or the corner of the semiconductor package 100, and the opening 24*a* may be positioned as described above to effectively prevent or suppress the detachment/peeling. For example, the detachment/peeling of the outer insulation layer from the outer interconnection pad 24*p* may be effectively prevented or suppressed in the embodiment described above, considering the stress applied to the semiconductor package 100. Accordingly, defects of the semiconductor package 100 may be reduced/prevented and reliability of the semiconductor package 100 may be enhanced.

Considering distribution of the stress applied to the semiconductor package 100, the openings 24*a* shown in FIG. 1 to FIG. 3, FIG. 4A, FIG. 4B, or FIG. 6A to FIG. 6D, the openings 24*a* shown in FIG. 7, and/or the openings 24*a* shown in FIG. 8 may be included together.

In FIG. 8, it is illustrated as an example that the outer interconnection pad 24*p* includes a plurality of openings 24*a* spaced apart from each other at an interval. However, the embodiments are not limited thereto. For example, only one opening 24*a* may be formed in the outer interconnection pad 24*p* in certain embodiments.

In FIG. 8, it is illustrated as an example that each of the plurality of interconnection pads 24*p* of the semiconductor package 100 includes the openings 24*a*. However, the embodiments are not limited thereto, and at least one of the plurality of outer interconnection pads 24*p* may include at least one opening 24*a*, and the other of the plurality of outer interconnection pads 24*p* might not include any opening 24*a* in certain embodiments. In FIG. 8, it is illustrated as an example that the plurality of outer interconnection pads 24*p* includes the openings 24*a* having the same shape and the same arrangement. However, the embodiments are not limited thereto, and shapes, arrangements, or so on of the openings 24*a* in the plurality of interconnection pads 24 may be different from each other in certain embodiments.

In FIG. 8, it is illustrated as an example that the interconnection pads include the outer interconnection pads 24*p*. In some embodiments, the interconnection pads may include an interconnection pad other than the outer interconnection pads 24*p*. For example, the interconnection pads of the embodiment illustrated in FIG. 8 are arranged in single file along the edge of the semiconductor package 100, but may be arranged in two or more rows in certain embodiments.

Unless otherwise described, the modification of the above embodiments and modified embodiments may be applied to the embodiment referring to FIG. 8.

Figure 9:
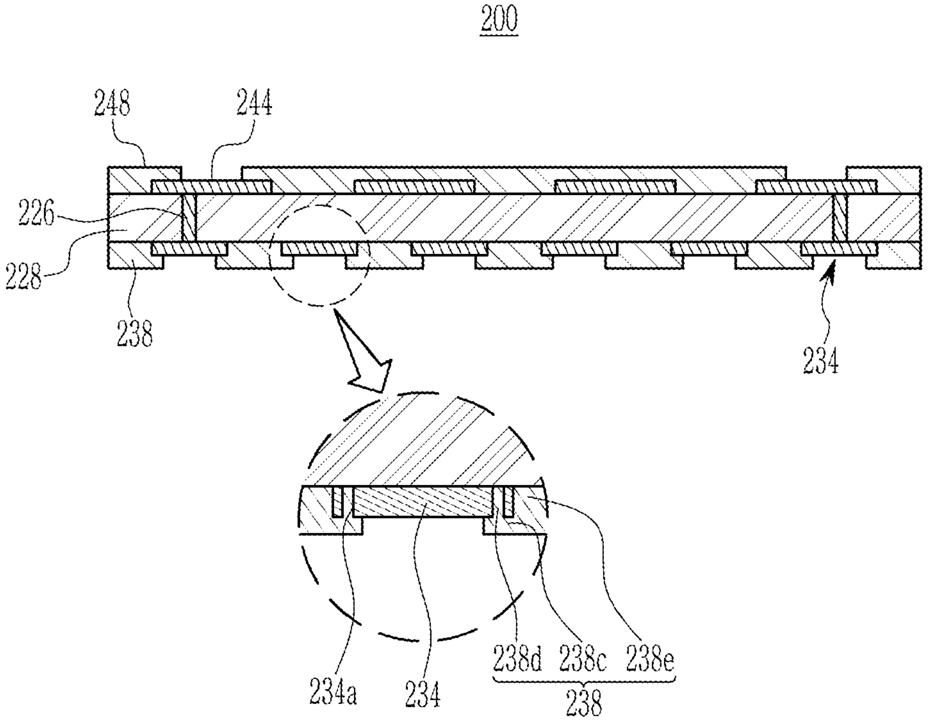
FIG. 9 is a cross-sectional view of a wiring substrate according to an embodiment.

FIG. 9 is a cross-sectional view of a wiring substrate according to an embodiment.

Referring to FIG. 9, a wiring substrate 200 according to an embodiment may include a base member 228, a first interconnection pad 234, a first insulation layer 238, a second interconnection pad 244, and a second insulation layer 248. The first interconnection pad 234 may be on one surface (e.g., a lower surface) of the base member 228, and the first insulation layer 238 may be on the one surface of the base member 228 and cover a part (e.g., an edge region) of the first interconnection pad 234. The second interconnection pad 244 may be on the other surface (e.g., an upper surface) of the base member 228, and the second insulation layer 248 may be on the other surface of the base member 228 to cover a part (e.g., an edge region) of the second interconnection pad 244. The wiring substrate 200 may further include a penetrating electrode or a through electrode 226 penetrating the base member 228 to electrically connect a first wiring portion including the first interconnection pad 234 and a second wiring portion including the second interconnection pad 244. For example, the through electrode 226 may electrically connect the first interconnection pad 234 and the second interconnection pad 244.

Here, with respect to the first interconnection pad 234, at least a part of the base member 228 may be an inner insulation layer, and the first insulation layer 238 may be an outer insulation layer. With respect to the second interconnection pad 244, at least a part of the base member 228 may be an inner insulation layer, and the second insulation layer 248 may be an outer insulation layer.

The base member 228 may include or be formed of any of various insulating materials. The first interconnection pad 234 and the second interconnection pad 244 may be interconnection pads where interconnection members are connected (e.g., contact), respectively. The descriptions of the interconnection pad and/or the outer interconnection pad in the above embodiments and modified embodiments may be applied to the first interconnection pad 234 and/or the second interconnection pad 244. The first insulation layer 238 and the second insulation layer 248 may include or be formed of any of various insulating materials. The descriptions of the outer insulation layer in the above embodiments and modified embodiments may be applied to the first insulation layer 238 and/or the second insulation layer 248.

For example, as shown in an enlarged view in FIG. 9, the first interconnection pad 234 may include an opening 234*a*. The descriptions of the opening in the above embodiments and modified embodiments may be applied to the opening 234*a* of the first interconnection pad 234. The first insulation layer 238 may include a first portion 238*c* on (e.g., vertically overlapping) the first interconnection pad 234, and a second portion 238*d* filling at least a part of the opening 234*a*. The first insulation layer 238 may further include a third portion 238*e* at an outside of (e.g., vertically non-overlapping) the first interconnection pad 234 on the base member 228. The descriptions of the first to third portions of the outer insulation layer in the above embodiments and modified embodiments may be applied to the first to third portions 238*c*, 238*d*, and 238*e* of the first insulation layer 238.

In some embodiments, the second interconnection pad 244 may include an opening. The descriptions of the opening in the above embodiments and modified embodiments may be applied to the opening of the second interconnection pad 244. The second insulation layer 248 may include a first portion on (e.g., vertically overlapping) the second interconnection pad 244, and a second portion filling at least a part of the opening. The second insulation layer 248 may further include a third portion at an outside of (e.g., vertically non-overlapping) the second interconnection pad 244 on the base member 228. The descriptions of the first to third portions of the outer insulation layer in the above embodiments and modified embodiments may be applied to the first to third portions of the second insulation layer 248.

As an example, the wiring substrate 200 may be a printed circuit board PCB. However, the embodiments are not limited thereto. Thus, the wiring substrate 200 may include or may be any of a redistribution portion, a redistribution substrate, an interposer, a connection substrate, or so on. In this instance, the interconnection pad to which the interconnection member is attached in the redistribution portion, the redistribution substrate, the interposer, the connection substrate, or so on may include the opening, and the outer insulation layer covering the opening may fill at least a part of the opening.

According to an embodiment, detachment/peeling of an outer insulation layer from the interconnection pad and a crack initiation or propagation at the inner insulation layer may be prevented or suppressed by improving structures of the interconnection pad and the outer insulation layer. Accordingly, a defect of the wiring substrate may be reduced and reliability of the wiring substrate may be enhanced.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context clearly indicates otherwise, and the present disclosure includes the additional embodiments.

While some examples have been described in connection with what is presently considered to be some practical embodiments, it is to be understood that the disclosure is not limited to the disclosed embodiments, and that the disclosure is intended to cover various modifications and equivalent arrangements included within the spirit and scope of the appended claims.

What is claimed is:

1. A semiconductor package, comprising:

a semiconductor chip; and a redistribution portion electrically connected to the semiconductor chip, wherein the redistribution portion includes:

an inner insulation layer;

an interconnection pad on the inner insulation layer, the interconnection pad including a first region and a second region outside the first region and having an opening; and an outer insulation layer including a first portion on the second region of the interconnection pad and a second portion filling at least a part of the opening, and wherein the first portion and the second portion have an integral structure in which the first portion and the second portion include the same material and the first portion and the second portion are continuously formed.

2. The semiconductor package of claim 1, wherein the opening penetrates through the interconnection pad, and in a cross-section, the second portion includes a portion filling an entire portion of the opening in a thickness direction.

3. The semiconductor package of claim 1, wherein a bottom surface of the second portion is in contact with the inner insulation layer in the opening.

4. The semiconductor package of claim 1, wherein the second portion fills an entire portion of the opening in a plan view.

5. The semiconductor package of claim 1, wherein the interconnection pad includes one or more openings, and an entire area of the one or more openings in the second region is smaller than the other area of the second region.

6. The semiconductor package of claim 1, wherein the opening is spaced apart from an inner edge of the second region and an outer edge of the second region.

7. The semiconductor package of claim 1, wherein a first distance between the opening and an inner edge of the second region is smaller than a second distance between the opening and an outer edge of the second region.

8. The semiconductor package of claim 1, wherein the second region of the interconnection pad includes a plurality of openings spaced apart from each other with an interval.

9. The semiconductor package of claim 8, wherein the plurality of openings has a symmetrical arrangement in the interconnection pad.

10. The semiconductor package of claim 1, wherein the interconnection pad is an outer interconnection pad adjacent to an edge or a corner of the semiconductor package, and in the outer interconnection pad, a plurality of openings is locally or partially positioned at a portion adjacent to the edge or the corner or at a portion opposite to the edge or the corner.

11. The semiconductor package of claim 1, wherein a diameter or a width of the opening is the same as or larger than a thickness of the interconnection pad.

12. The semiconductor package of claim 1, wherein a diameter or a width of the opening is 1 μm to 40 um.

13. The semiconductor package of claim 1, wherein the semiconductor package has a fan-out structure.

14. A wiring substrate, comprising:
an inner insulation layer;
an interconnection pad on the inner insulation layer, the interconnection pad including a first region and a second region outside the first region and having an opening; and
an outer insulation layer including a first portion on the second region of the interconnection pad and a second portion filling at least a part of the opening,
wherein an entire area of the second portion of the outer insulation layer is smaller than an entire area of the outer insulation layer vertically overlapping the interconnection pad, and
wherein a first distance between the second portion of the outer insulation layer and an inner edge of the second region of the interconnection pad vertically overlapping the outer insulation layer is smaller than a second distance between the second portion of the outer insulation layer and an outer edge of the second region.

15. The wiring substrate of claim 14, wherein the wiring substrate is included in a fan-out semiconductor package or is a printed circuit board.

16. A semiconductor package, comprising:
an insulation layer;
an interconnection pad on the insulation layer; and
a cover insulation layer on an edge region of the interconnection pad on the insulation layer, the cover insulation layer including a connection portion penetrating a part of the interconnection pad and connected to the insulation layer,
wherein an entire area of the connection portion of the cover insulation layer is smaller than an entire area of the cover insulation layer vertically overlapping the interconnection pad, and
wherein a first distance between the connection portion and an inner edge of the edge region of the interconnection pad vertically overlapping the cover insulation layer is smaller than a second distance between the connection portion and an outer edge of the edge region.

17. The semiconductor package of claim 16, wherein a bottom surface of the connection portion is directly connected to the insulation layer.

* * * * *